United States Patent [19]
Ito

[11] Patent Number: 6,122,718
[45] Date of Patent: Sep. 19, 2000

[54] COLUMN ADDRESS COUNTER WITH MINUS TWO SUBTRACTOR FOR ADDRESS COMPARE

[75] Inventor: Kazuya Ito, Hamura, Japan

[73] Assignee: Hitachi, Ltd., Tokyo, Japan

[21] Appl. No.: 08/988,730

[22] Filed: Dec. 11, 1997

Related U.S. Application Data

[63] Continuation-in-part of application No. 09/084,262, Jun. 16, 1997, abandoned
[60] Provisional application No. 60/022,204, Jul. 19, 1996.
[51] Int. Cl.[7] .................................................. G06F 12/02
[52] U.S. Cl. .......................................... 711/219; 711/218
[58] Field of Search ..................................... 711/219, 218

[56] References Cited

U.S. PATENT DOCUMENTS 5,208,782  5/1993  Sakuta et al. ....................... 365/230.03

OTHER PUBLICATIONS

Motorola Technical Information Center, Motorola Memories, 32K ×9 Bit BurstRAM Synchronous Static RAM With Burst Counter and Self–Timed Write, Rev. 7, 1991.

*Primary Examiner*—Reginald G. Bragdon
*Attorney, Agent, or Firm*—Haynes and Boone, LLP

[57] ABSTRACT

The present invention is a method and circuit for providing a burst address counter with a fast burst-done signal. In a preferred embodiment, a synchronous memory device includes a counter for producing a sequence of burst addresses, based on an external address. In addition, the counter drives the burst-done signal to indicate completion of the burst sequence. The counter includes a register for receiving the external address, an incrementor for advancing the external address to produce the next address of the sequence of burst addresses, a minus-two subtractor for determining a second-to-last burst address of the burst sequence, and a comparator. By utilizing the minus-two subtractor, the comparator can determine the end of the burst sequence earlier than conventional counters. This is because the minus-two subtractor determines the next-to-last address of the sequence, which allows the comparator to start asserting the burst-done signal at an earlier time.

22 Claims, 8 Drawing Sheets

COLUMN ADDRESS COUNTER WITH MINUS TWO SUBTRACTOR FOR ADDRESS COMPARE

CROSS REFERENCE

This application is a continuation-in-part of U.S. application Ser. No. 09/084,262 filed Jun. 16, 1997 abandoned, which claims the benefit of U.S. provisional application Ser. No. 60/022,204 filed Jul. 19, 1996.

BACKGROUND OF THE INVENTION

The present invention relates generally to semiconductor design technology, and more particularly to a method and apparatus for providing a fast address counter for use with an integrated circuit device.

Speed and timing constraints have always been important considerations in designing electronic systems. Most system designs must match the timing requirements of all the components used, yet still be optimized for high speed. As a result, many integrated circuits, or "chips," utilize a synchronous design. A synchronous chip is one in which components of the chip are connected to a common system clock ("CLK"). Synchronous chips have latches, registers and counters connected to inputs and outputs, all on a single monolithic chip. Furthermore, synchronous chips provide many benefits to system designers, such as fewer external logic chips and higher operation speed.

One example of a synchronous chip is a synchronous dynamic random access memory ("SDRAM") with an on-board address counter. Address counters are commonly used with processors that are capable of burst read or burst write operation. A burst operation is a method of transferring a series of data from one device to another. For example, when a processor initiates a burst read operation to an SDRAM, it provides a base address to denote a memory location in the SDRAM from which a first data is to be read. The processor then expects to read data at one or more memory locations in the SDRAM according to a predetermined burst sequence.

Because the burst sequence has been predetermined, once the first memory location is accessed, counters that are separate from the processor are used to anticipate the next memory locations to be accessed. In so doing, operation of the SDRAM is improved because the counters can quickly generate an address for the next memory location to be accessed, and can initiate the access to that memory location next at an early time.

As processor operation speed, or frequency, has increased, the corresponding speed requirements for the address counters has increased. Therefore, in order to improve operation, address counters have been incorporated onto the SDRAMs themselves, thereby reducing any propagation delays resulting from discrete counters and SDRAMs. However, processor frequency has continued to increase, and simply including a conventional counter inside the SDRAM is not sufficient to meet the strict timing requirements of many modern processors, as described below.

Figure 1:
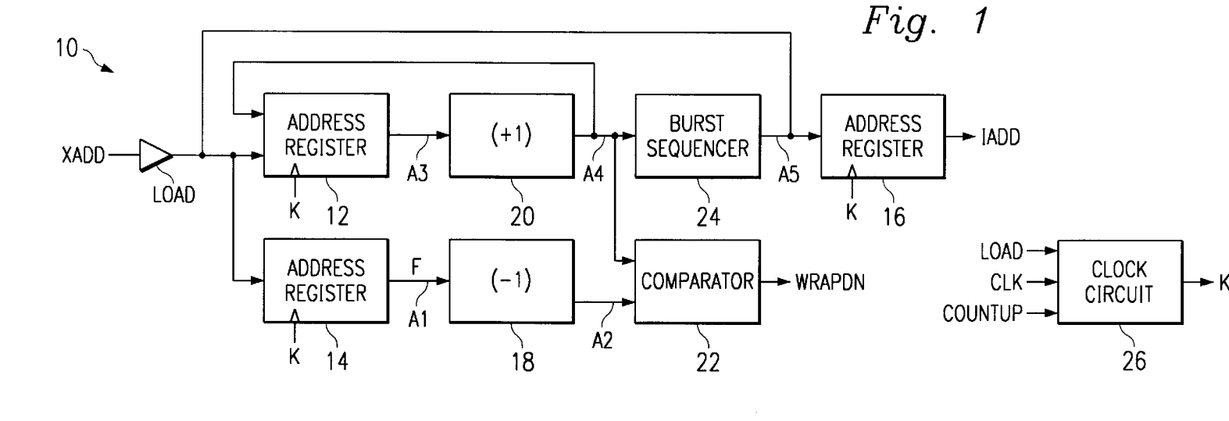
FIG. 1 is a block diagram of a counter.

FIG. 1 is a block diagram of a counter, which is designated generally by a reference numeral 10. The counter 10 is incorporated into a SDRAM (not shown). The counter 10 receives an external address from an external address bus XADD. It is understood that supplying an address to a memory device is well known in the art, and will not be further described.

It is a goal of the counter 10 to produce internal addresses on the internal address bus IADD, based upon the external address, in a predetermined burst sequence. Although bursts can be of many different lengths, such as one, two, four, eight or sixteen address locations, an exemplary burst sequence for two addresses A1:A0 of a 32 bit address A31:A0 is:

| | | | |
|---|---|---|---|
| External Address | A31:A2 | A1 | A0 |
| First Burst Address | A31:A2 | A1 | A0\ |
| Second Burst Address | A31:A2 | A1\ | A0 |
| Third Burst Address | A31:A2 | A1\ | A0\ |

(note: the symbol "\" denotes an inverted address)

For the remaining description, the exemplary burst sequence shown above will be used. However, it is understood that other burst sequences and lengths may be used. In addition, it is a goal of the counter 10 to produce an end-of-burst signal WRAPDN, to indicate that the burst sequence is complete. The WRAPDN signal must also meet certain processor-defined set-up and hold times.

The counter 10 includes three address registers 12, 14, 16, an incrementor 20, a subtractor 18, a comparator 22, and a burst sequencer 24. Each of the registers 12, 14, 16 is synchronized by a K signal, which is driven by a clock circuit 26. The K signal is responsive to three control signals: LOAD, CLK and COUNTUP. The LOAD signal indicates when the address bus XADD contains a valid external address. The CLK signal is the system clock, as described above. The COUNTUP signal indicates when, during a burst sequence, the next memory location of the burst sequence may be accessed.

The burst sequencer 24 is programmable for different burst sequences. Using the exemplary burst sequence described above, the burst sequencer 24 simply passes signals straight through without altering them. However, the burst sequencer 24 can be programmed to support different burst sequences.

In operation, the LOAD signal allows the external address on the external address bus XADD to be loaded into the address registers 12, 14, 16. The address register 16 drives the external address on the internal address bus IADD as the first address of the predetermined burst sequence.

The address register 14 drives an intermediate address A1, which is equal to the external address, to the subtractor 18. The subtractor 18 subtracts one from the intermediate address A1 to produce an intermediate address A2, which is equal to the third internal address of the predetermined burst sequence, as shown above.

Meanwhile, the address register 12 drives an intermediate address A3, which is initially equal to the external address, to the incrementor 20. The incrementor 20 adds one to the intermediate address A3 to produce an intermediate address A4, which is equal to the first burst address of the predetermined burst sequence, as shown above. The intermediate address A4 is supplied to the burst sequencer 24, which produces an intermediate address A5 according to the predetermined burst sequence. The intermediate address A5 is then supplied to the address register 16. The address register 16 thereby updates the internal address on the internal address bus IADD to the next address of the predetermined burst sequence.

The intermediate address A4 is also looped back to the address register 12 in order to calculate the next burst address. Furthermore, the intermediate address A4 is supplied to the comparator 22, where it is compared with the intermediate address A2. In this way, once the intermediate address A4 is equal to the third burst address (which is the last address of the predetermined burst sequence), the comparator 22 can assert the WRAPDN signal.

Figure 2:
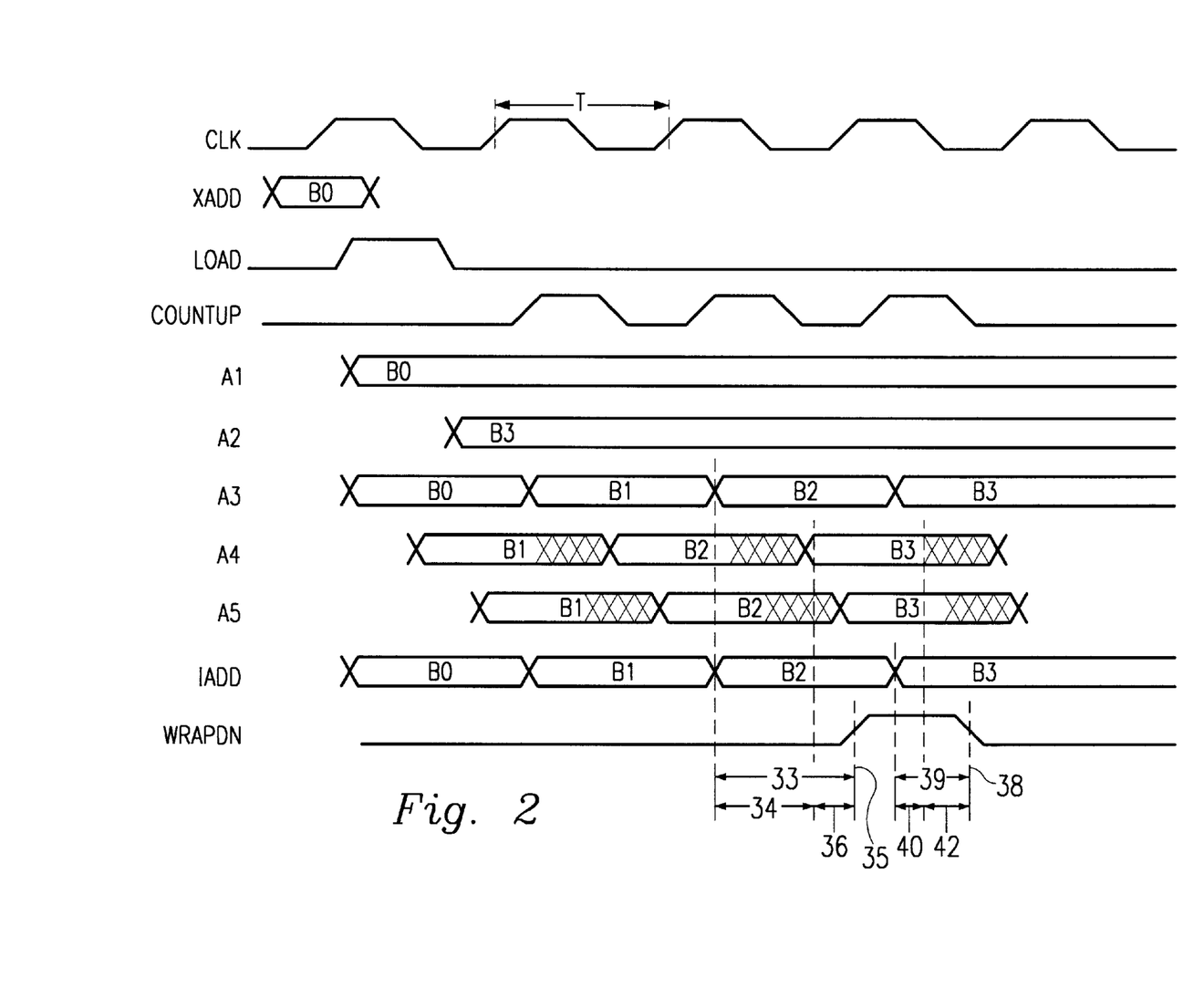
FIG. 2 is a timing diagram of the counter of FIG. 1.

FIG. 2 is a timing diagram for the counter circuit of FIG. 1. The external address, first burst address, second burst address and third burst address are denoted by the reference numerals B0, B1, B2, and B3, respectively.

Of particular importance is the waveform for the WRAPDN signal. The WRAPDN signal is asserted at a time 35, which is determined by a propagation delay 33. The propagation delay 33 is the sum of a first delay 34 and a second delay 36. The first delay 34 is due to the propagation delay of the incrementor 20 when driving the burst address B3. The incrementor 20 drives the burst address B3 on the intermediate address A4 after the intermediate address A3 is equal to the burst address B2. The second delay 36 is a high-going delay caused by propagation through the comparator 22.

Likewise, the WRAPDN signal is de-asserted at a time 38, which is determined by a propagation delay 39. The propagation delay 39 equals a sum of a hold time delay 40 of the incrementor 20 plus a low-going delay 42 caused by propagation through comparator 22.

The delays 33 and 39 create timing problems for the counter 10. For the sake of example, the frequency of the clock signal CLK will be 100 mega-hertz ("MHz"), which provides a period T of 10 nano-seconds ("ns"). A typical time for the delay 34 is 8 ns and for the delay 36 is 2 ns. As a result, the cumulative delay 33 for the assertion of the WRAPDN signal is 10 ns (8 ns+2 ns), or one clock period. Such a delay is too long to meet the set-up time requirements of many conventional processors. As a result, a clock period is wasted while waiting for the assertion of the WRAPDN signal. It would be advantageous if the WRAPDN signal was asserted early enough to save the wasted clock period.

SUMMARY OF THE INVENTION

The present invention, accordingly, is a method and circuit for providing a burst address counter with a fast burst-done signal. In a preferred embodiment, a synchronous memory device includes a counter for producing a sequence of burst addresses, based on an external address. In addition, the counter drives the burst-done signal to indicate completion of the burst sequence. The counter includes a register for receiving the external address, an incrementor for advancing the external address to produce the next address of the sequence of burst addresses, a minus-two subtractor for determining a second-to-last burst address of the burst sequence, and a comparator.

By utilizing the minus-two subtractor, the comparator can determine the end of the burst sequence earlier than conventional counters. This is because the minus-two subtractor determines the next-to-last address of the sequence, which allows the comparator to start asserting the burst-done signal at an earlier time.

A technical advantage achieved with the present invention is that the burst-done signal is asserted early so that timing requirements of high speed processor systems may be met.

DETAILED DESCRIPTION OF THE PREFERRED EMBODIMENT

As described above, FIGS. 1 and 2 illustrate a counter and associated timing diagram.

Figure 3:
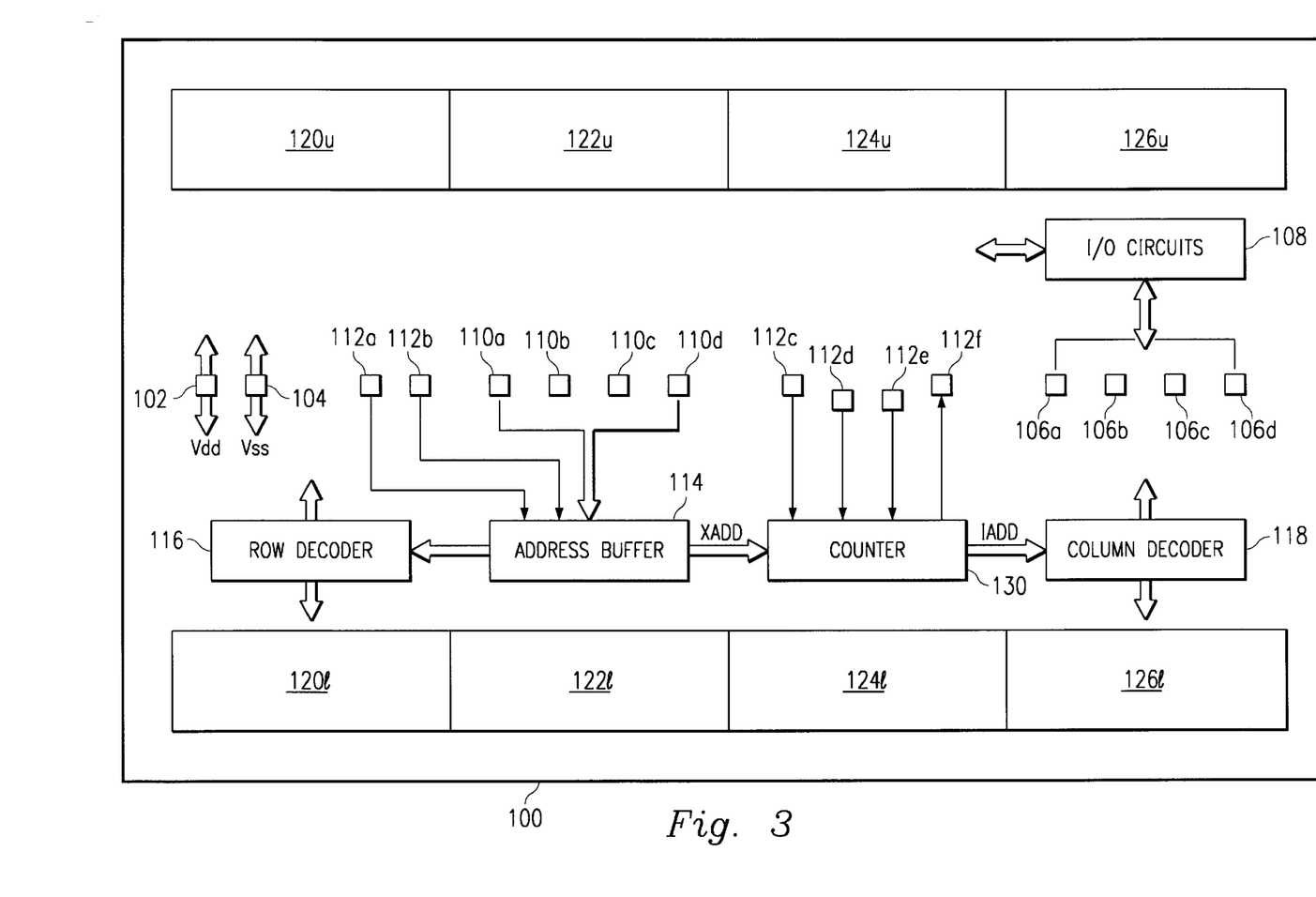
FIG. 3 is a block diagram of a 64 Mbit SDRAM embodying features of the present invention.

Referring to FIG. 3, the reference numeral 100 designates a synchronous memory device embodying features of the present invention. While in a preferred embodiment of the invention, the device 100 is a 64 Mbit synchronous dynamic random access memory ("SDRAM"), it should be understood that the present invention is not limited to use with a SDRAM, but may be used in conjunction with any circuit device operating at high speeds and utilizing a counter.

The device 100 receives a positive external power Supply ($V_{DD}$) and a negative external power supply ($V_{SS}$) through input pads 102 and 104, respectively. The device 100 transmits and receives data input-outputs (I/Os) through I/O pads 106a, 106b, 106c, and 106d. Furthermore, the device 100 includes a plurality of input buffers, output buffers and other circuits, referenced generally by an I/O circuits group 108. The I/O circuits group 108 and the input pads 106a–106d are conventional for most SDRAMs, and will not be discussed in greater detail.

The device 100 receives an external address through address pads 110a, 110b, 110c, and 110d, and control signals RAS\, CAS\, CLK, CKE, WE\ and DQM through pads 112a, 112b, 112c, 112d, 112e, and 112f respectively. Each of the signals RAS\, CAS\, CLK, CKE, WE\ and DQM are conventional, and some of which are used to derive internal signals LOAD and COUNTUP. The LOAD and COUNTUP signals are also conventional internal signals as described above, with reference to FIG. 1. The device 100 also drives an internal control signal WRAPDN'. In the preferred embodiment, many more address and control signal pads may exist, but their functionality can be represented by the pads 110a–110d and 112a–112f.

The device 100 also contains a plurality of address buffers and decoders, represented generally by the address buffer group 114, the row address decoder group 116 and the column address decoder group 118. The address buffer group 114 and decoder groups 116 and 118 are conventional for most DRAMs and SDRAMs, and will not be discussed in greater detail.

The device 100 contains 64 Meg (1 meg equals 1,048,576) of memory cells. The memory cells are grouped into four equal-sized banks 120, 122, 124, 126, each having an upper and lower portion represented by the suffix "u" or "l", respectively. The memory cells are conventional, and utilize many different signal lines, amplifier circuits and decoder circuits. Because the banks 120–126 contain memory cells conventional for most 64 Mbit DRAMs, their functionality will not be discussed in greater detail.

The device 100 contains a counter 130. The counter 130 is an improvement of the conventional counter 10 (FIG. 1);

therefore, the circuits and signals of the improved counter 130 that are identical to those of the conventional counter 10 will be designated by the same reference name or numeral, and any changed, modified or improved circuits and signals will be designated by a new name or numeral.

The counter 130 is connected to the address buffer 114 through an external address bus XADD. Likewise, the counter 130 is connected to the column decoder 118 through an internal address bus IADD. The counter 130 is also connected to the power supplies $V_{DD}$ and $V_{SS}$.

The counter 130 receives as inputs the external address from the external address bus XADD, and the external and internal control signals CLK, LOAD, and COUNTUP. The counter 130 drives internal addresses on the internal address bus IADD that simulate a predetermined burst sequence. Although bursts can be of many different lengths, such as one, two, four, eight or sixteen address locations, for the sake of example, the predetermined burst sequence is:

| External Address     | A31:A2 | A1  | A0  |
|----------------------|--------|-----|-----|
| First Burst Address  | A31:A2 | A1  | A0\ |
| Second Burst Address | A31:A2 | A1\ | A0  |
| Third Burst Address  | A31:A2 | A1\ | A0\ |

Furthermore, the counter 130 drives the internal WRAPDN' signal.

Figure 4:
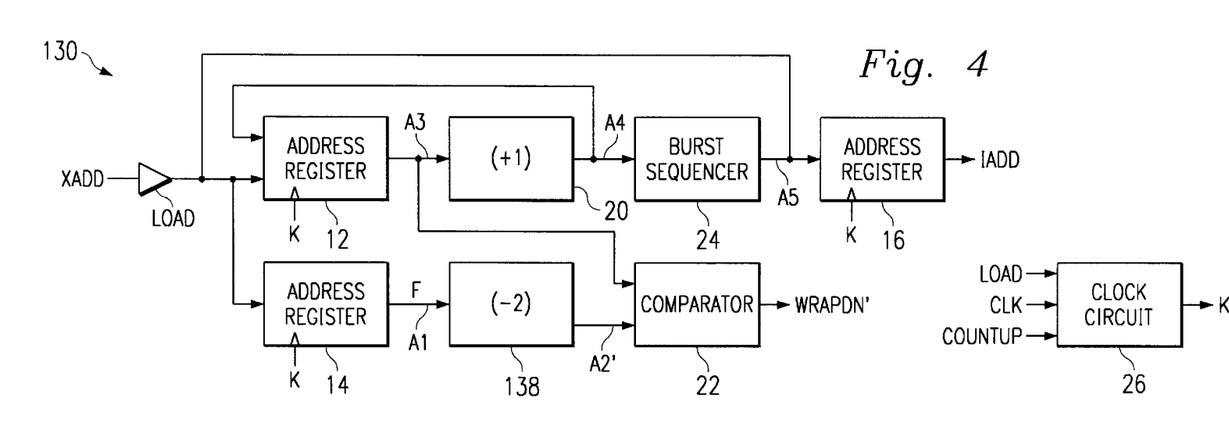
FIG. 4 is a block diagram of an improved counter for the 64 Mbit SDRAM of FIG. 4.

Referring to FIG. 4, the counter 130 includes three address registers 12, 14, 16, an incrementor 20, a comparator 22, and a burst sequencer 24. Each of these circuits are similar to those used in the conventional counter 10 of FIG. 1. Each of the registers 12, 14, 16 is synchronized by a K signal, which is driven by a clock circuit 26 and derived from the three control signals LOAD, CLK and COUNTUP.

The counter 130 also includes a minus two subtractor 138. The minus-two subtractor 138 is used to determine the second-to-last address of the predetermined burst sequence. Using the predetermined burst sequence described above, the minus-two subtractor 138 may simply invert only one of the address lines (A1) of the external address.

In operation, the LOAD signal allows the external address from the external address bus XADD to be loaded into the address registers 12, 14, 16. The address register 16 drives the external address on the internal address bus IADD as the first address of the predetermined burst sequence.

The address register 14 drives an intermediate address A1, which is equal to the external address, to the minus two subtracter 138. The subtractor 138 subtracts two from the intermediate address A1 to produce an intermediate address A2', which is equal to the second internal address of the predetermined burst sequence shown above.

Meanwhile, the address register 12 drives an intermediate address A3, which is initially equal to the external address, to the incrementor 20. The incrementor 20 adds one to the intermediate address A3 to produce an intermediate address A4, which is equal to the first burst address of the predetermined burst sequence, as shown above. The intermediate address A4 is supplied to the burst sequencer 24, which produces an intermediate address A5. The intermediate address A5 is then supplied to the address register 16 to drive the internal addresses on the internal address bus IADD. The address register 16 updates the internal addresses. The intermediate address A4 is also looped back to the address register 12 in order to calculate the next burst address.

The intermediate address A3 is also supplied to the comparator 22, where it is compared with the intermediate address A2'. In this way, once the intermediate address A3 is equal to the second burst address, the comparator 22 can begin to assert the WRAPDN' signal.

The burst sequencer 24 is programmable for different burst sequences. Using the exemplary burst sequence described above, the burst sequencer 24 simply passes signals straight through without altering them. The burst sequencer 24 is also connected to the intermediate address A1 and a BURST signal (not shown). As a result, the BURST signal can selectively enable the burst sequencer 24 to produce a different burst sequence by exclusive or-ing the intermediate address A1 with the intermediate address A4, or by performing other conventional operations.

Figure 5:
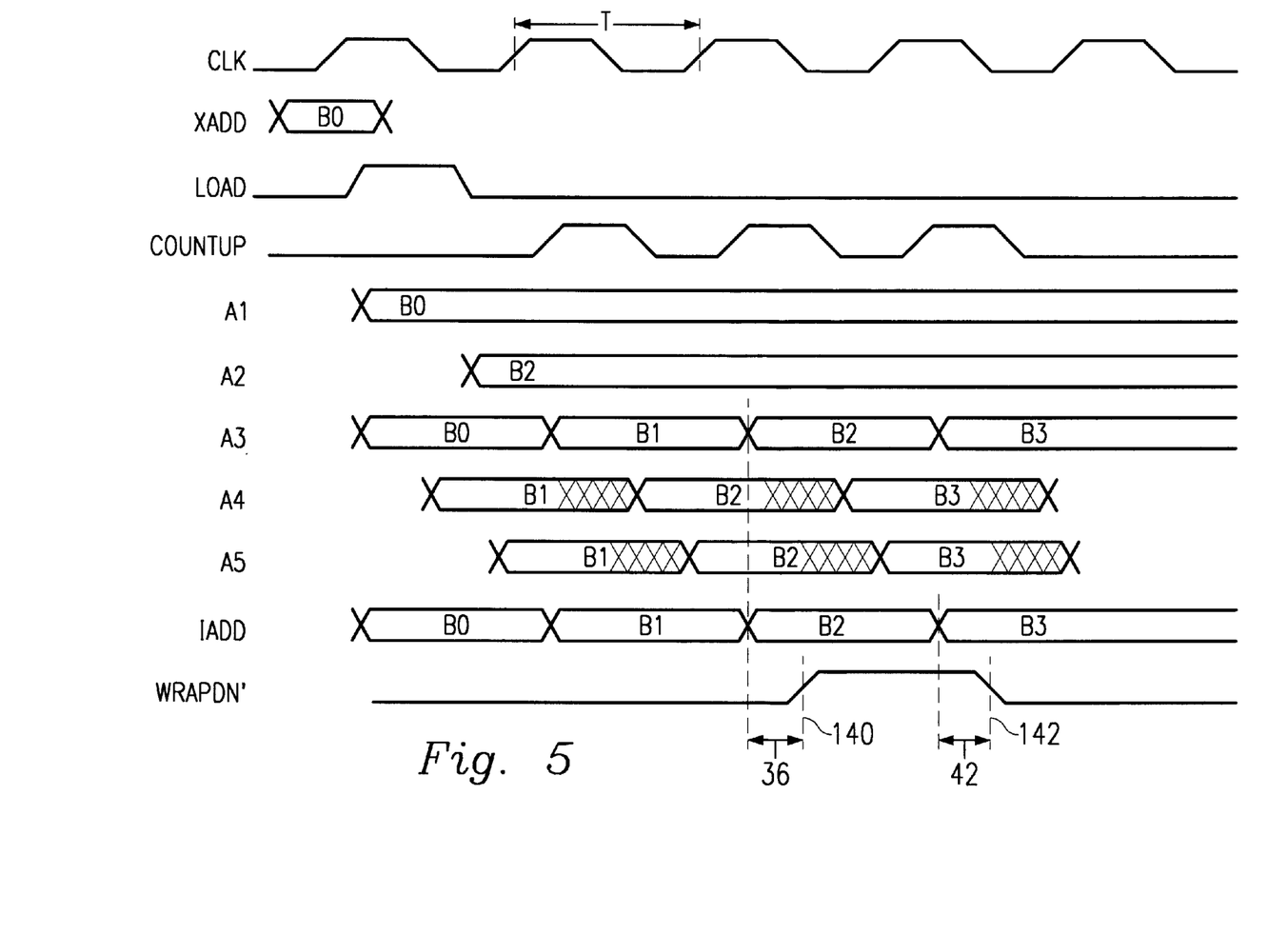
FIG. 5 is a timing diagram of a burst sequence from the improved counter of FIG. 4, illustrating the features of the present invention.

Referring to FIG. 5, the external address, first burst address, second burst address and third burst address are denoted by the reference numerals B0, B1, B2, and B3, respectively. Of particular importance is the waveform for the WRAPDN' signal. The WRAPDN' signal of FIG. 5 is improved over the WRAPDN signal of FIG. 2. The WRAPDN' signal is asserted at a time 140, which is determined by a high-going delay 36 caused by the comparator 22 once the intermediate address A2 equals the second burst address B2. Likewise, the WRAPDN signal is de-asserted at a time 142, which is determined by a low-going delay 42 caused by the comparator 22, once the intermediate address A2 equals the third burst address B3.

To illustrate some of the benefits of the present invention, the same timing example used with FIG. 2 will be applied to FIG. 5. The frequency of the clock signal CLK is 100 MHz, which provides a period T of 10 ns. A typical time for the delay 36 is 2 ns. Note, however, that there is no delay 34 from generating the burst address B3 from the intermediate address A3, as exists with the counter 10. As a result, the WRAPDN' signal of the present invention is asserted 8 ns earlier than the WRAPDN signal of FIG. 2.

Figure 6:
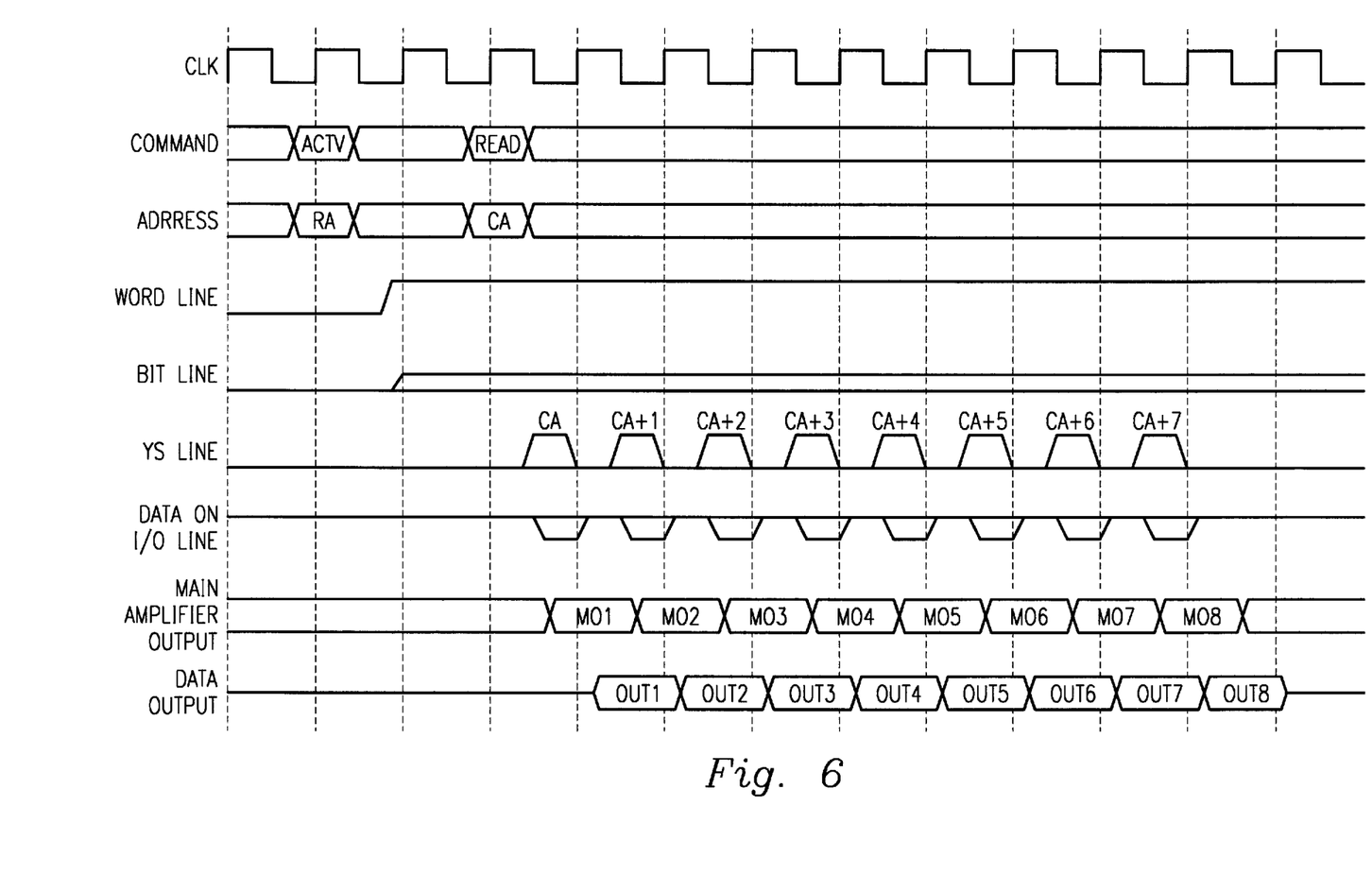
FIG. 6 is another timing diagram of a burst sequence illustrating the features of the present invention.

Referring to FIG. 6, an expanded version of the burst operation timing of FIG. 5 illustrates an 8-bit burst read operation. After the first address RA and CA are received, successive data can be obtained in a burst mode, with a burst length of 8 cycles and a CAS latency of 2 cycles.

Figure 7:
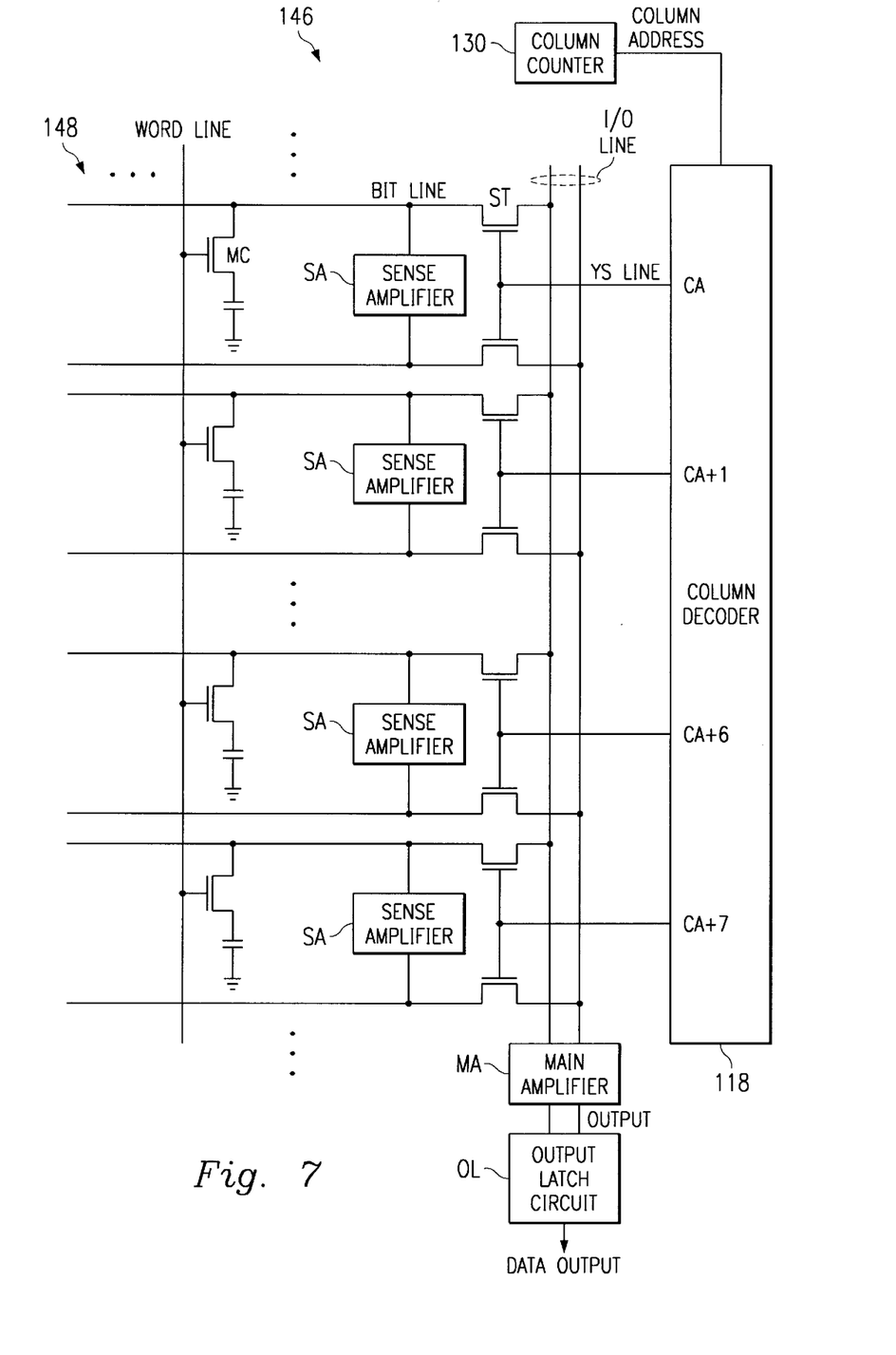
FIG. 7 is a schematic diagram of a portion of the 64 Mbit SDRAM of FIG. 4.

Referring also to FIG. 7, the timing diagram of FIG. 6 may be implemented by a sub-circuit 146 of one of the banks 120, 122, 124, or 126 and the I/O circuit 108, all of the device 100 (FIG. 3). The sub-circuit 146 includes an array 148 of memory cells MC arranged in a matrix at intersections of word lines and bit lines; sense amplifiers SA corresponding to the memory cells MC; a pair of selection MOS transistors ST connecting the sense amplifiers SA to the I/O lines; a main amplifier MA connected to the I/O lines; and an output latch circuit OL for latching and outputting the output of the main amplifier MA. Each pair of the selection MOS transistors ST is connected through a YS line to a column decoder 118, which receives a column address from a column counter 130. By disconnecting the I/O lines from the output latch circuit OL after the output latch circuit OL has provided to the I/O lines the data read out of the memory cells MC, it is possible to perform other operations such as precharging the I/O lines having a large load capacitance while the latched data are being taken out.

In a burst read operation, the memory array 148 receives a command and an address at the leading edge of the clock CLK. In response to an active (ACTV) command, the memory array 148 receives the row address RA to select the corresponding word line. Signals from the selected MC are provided onto the bit lines—eight-bit lines in this case—and are amplified by the sense amplifier SA. In response to a read (READ) command issued two cycles (CAS latency) after the ACTV command, the memory array 148 receives the column address CA, and reads the amplified signals with a pair of selection MOS transistors ST from the corresponding bit lines onto the I/O line, and outputs the amplified signals to the external circuit in synchronism with the clock CLK. After being amplified by the main amplifier MA, the outputs (M01–M08) are latched by the output latch circuit OL, which then provides the outputs (OUT1–OUT8) to the external circuit in synchronism with the clock CLK.

At this time, the column counter 130 can instantly generate the address of the next memory cell MC to be accessed. Hence, when a column address is specified by the column counter 130, the YS lines corresponding to the column addresses (CA to CA+7) from the specified address are selected successively and the selection MOS transistors ST are driven, thereby outputting 8-bit signals successively, from the corresponding eight-bit lines onto the I/O lines.

The above description considers a burst length of 8 cycles and a CAS latency is 2 cycles. A burst read operation in which the CAS latency is three cycles also includes basically the same internal operation except that the number of cycles from the address specification to the data output is different. For other burst lengths, too, it is possible to successively output data of desired bits such as 2, 4, 16, etc. in a desired number of cycles such as 1, 2, 4, etc.

Figure 8:
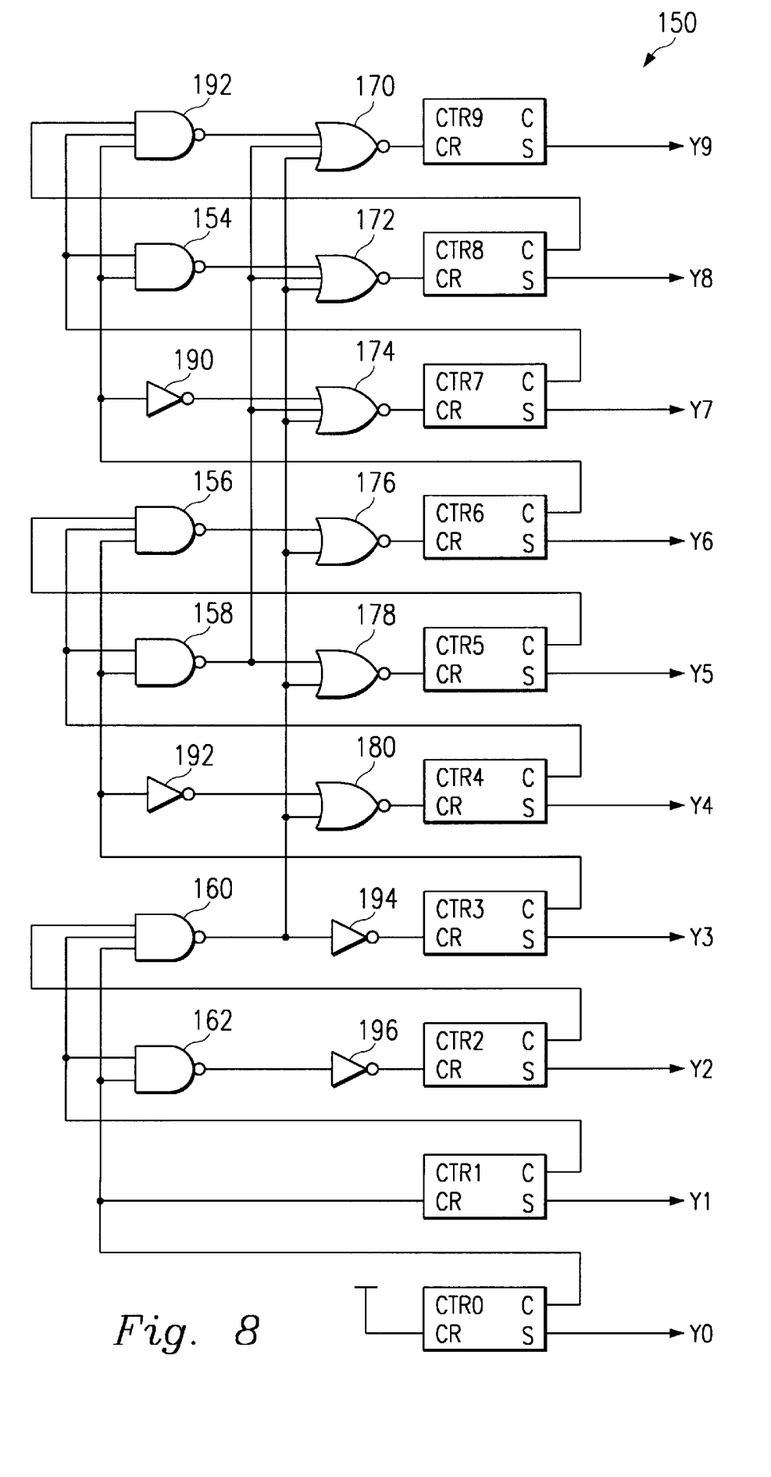
FIG. 8 is a schematic of a carry generation circuit used by the 64 Mbit SDRAM of FIG. 4.

Referring to FIG. 8 the address register 12 and adder 20 of the counter 130 (FIG. 4) include a carry generation circuit 150. The carry generation circuit 150 provides a 10-bit parallel adder for column address CA (i.e., <Y9 . . . Y0>) with a two-stage carry-look-ahead adder circuit configuration for improving the speed of address addition. Such improvement comes by performing addition for each output bit (Y0–Y9) to find a partial sum, while at the same time independently performing carry calculation for all output bits, and then adding the partial sum and the carry.

The carry generation circuit 150 includes ten control registers CTR0–CTR9 for calculating partial sums and peripheral logic including NAND gates 152–162, NOR gates 170–180 and invertors 190–196. The peripheral logic is connected to the input stages of the control registers CTR0–CTR9 and performs carry calculations for all output bits (Y0–Y9). The carry generation circuit 150 is so designed that the carry outputs (C) from the control registers for the low-order bits (e.g., Y0) are reflected on the carry inputs (CR) of all control registers for the higher-order bits (e.g., Y9). The outputs (S) of the control registers CTR0–CTR9 provide the 10-bit data (Y0–Y9) that corresponds to the intermediate address A4 (FIG. 4).

For example, the carry input CR of the control register CTR0 for bit Y0 is fixed to a high level, and its carry output C is provided to the carry input CR of the control register CTR1 for bit 'Y1. At the same time the carry outputs C of the control registers CTR0 and CTR1 are provided to the inputs of the 2-input NAND gate 162, the output of which being connected to the carry input CR of the control register CTR2 for bit Y2. In a similar manner, the carry outputs C of the lower-order bits are provided for the higher-order bits.

Figure 9:
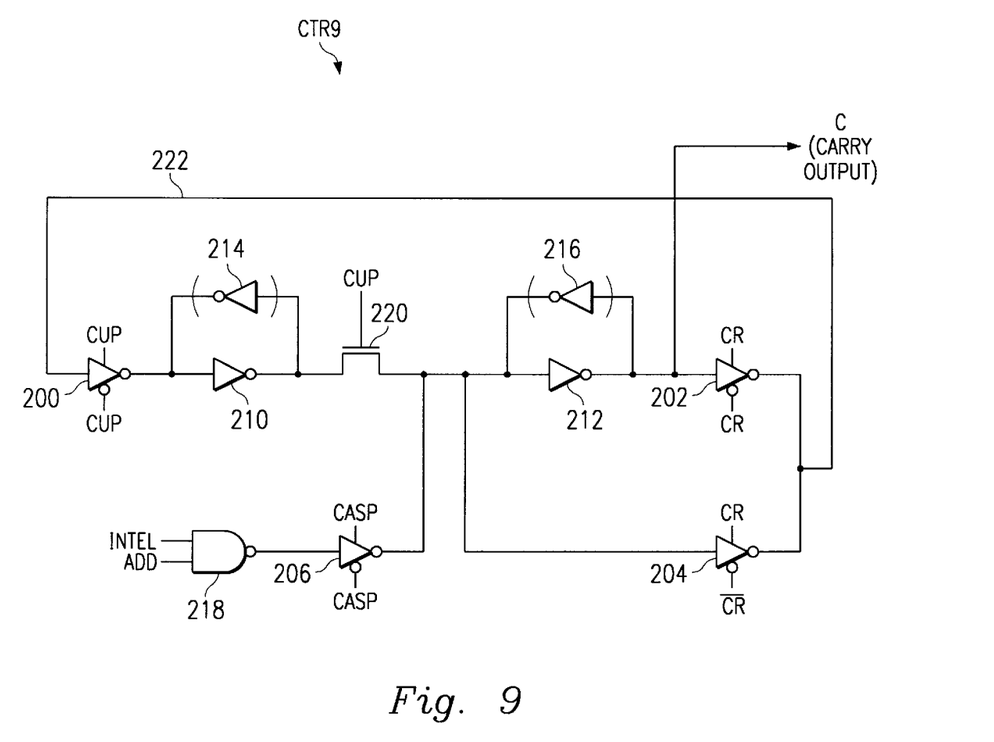
FIG. 9 is a schematic of a control register of the carry generation circuit of FIG. 8.

Referring also to FIG. 9, each control register CTR0–CTR9 of FIG. 8 includes a binary counter in the form of a loop feedback circuit. For example, the control register CTR9 includes a plurality of clocked invertors 200–206, a plurality of invertors 210–216, a NAND gate 218, and a transfer CMOS transistor 220. The control register CTR 9 also receives the following control signals: control signals CUP, CUP\ (the COUNTUP signal of FIG. 5 and its inverted signal); control signals CR, CR\ (the signal carried up from a lower-order bit control register and its inverted signal); control signals CASP, CASP\ (the LOAD signal of FIG. 5 and its inverted signal); a control signal INTEL (a control signal for changing the sequence order of the burst mode); and the address signal ADD (the external address XADD of FIG. 5).

The clocked inverter 200 is controlled by control signals CUP\, CUP and receives a loop feedback signal 222. The transfer CMOS transistor 220 is connected to the clocked inverter 200 via the inverter 210 and its gate is controlled by the control signal CUP. The clocked inverter 202 is connected to the transfer CMOS transistor 220 via the inverter 212 and is controlled by control signals CR\, CR. The clocked inverter 204 is connected in parallel with the inverter 212 and the clocked inverter 202 and is controlled by control signals CR, CR\. The clocked inverter 206 is connected to a connecting node between the transfer CMOS transistor 220 and the inverter 212 and is controlled by control signals CASP\, CASP. The NAND gate 218 is connected to the clocked inverter 206 and is fed with the address signal ADD and the control signal INTEL. Statically, the invertors 210, 212 are connected to anti-parallelly connected invertors 214, 216 to retain electric charge of the clocked invertors 200, 206, respectively.

In operation, the control register CTR 9 first receives the address signal ADD fed to the NAND gate 218 by controlling the clocked inverter 206 according to the CASP signal. The address ADD is the first address CA (FIG. 6) of the burst sequence. The second address CA+1 of the burst sequence is generated by controlling the clocked inverter 200 and the transfer CMOS transistor 220 with the CUP signal to advance the first address CA. Similarly, the remaining address of the burst sequence are generated. In such a way, the address is advanced successively to the next address of the burst sequence before being fed back through the loop 222.

When the address is advanced to the last address CA+7 of the burst sequence, the CUP signal is stopped. That is, the intermediate addresses of the burst sequence are fed to the comparator 22 of FIG. 4 and, when it becomes equal to the last burst address of the predetermined burst sequence, the comparator 22 generates a WRAPDN' signal for terminating the count-up burst sequence.

When, for example, a control register receives a high-level carry signal CR from a lower-order bit control register, the control register inverts the received carry signal and outputs the inverted signal to higher-order bit control registers because the control register operates through a three-stage inverter series including the clocked inverter 200, the inverter 210 and the clocked inverter 204. When the control register receives a low-level carry signal CR, it operates through a four-stage inverter series including the clocked inverter 200, the inverter 210, the inverter 212 and the clocked inverter 202, and thus outputs the carry signal as it is to the higher-order bit control registers. As a result, each control register can output data (Y0–Y9) as a burst sequence address and reflect the carry signal from a lower-order bit control register on all higher-order bit control registers.

Although illustrative embodiments of the present invention have been shown and described, a latitude of modification, change and substitution is intended in the foregoing disclosure, and in certain instances, some features of the invention will be employed without a corresponding use of other features. For example, the address register 14 and the minus-2 subtractor 138 may have a carry generation circuit such as is shown in FIGS. 8 and 9. Furthermore, additional buffers, drivers, delay circuits and other circuits may be added to the illustrative embodiment without altering the scope of the invention. Accordingly, it is appropriate that the appended claims be construed broadly and in a manner consistent with the scope of the invention.

What is claimed is:

1. A counter for producing a sequence of burst addresses from an external address and for producing a burst-done signal to indicate completion of the burst sequence, the counter comprising:

a register for receiving the external address;

a first circuit for advancing the external address to produce a next address of the sequence of burst addresses;

a second circuit for determining a second-to-last burst address of the sequence of burst addresses;

a third circuit for determining if the next address equals the second-to-last address and for asserting the burst-done signal in response thereto.

2. The counter of claim 1 wherein the first circuit is an incrementor circuit.

3. The counter of claim 1 wherein the second circuit is a minus-two subtractor circuit.

4. The counter of claim 1 wherein the third circuit is a comparator.

5. The counter of claim 1 wherein the first circuit comprises a burst sequencer so that the sequence of burst addresses is programmable.

6. A synchronous memory device comprising a plurality of memory cell locations, a plurality of address pads for receiving an external address, and a counter for producing a plurality of internal addresses according to a predetermined sequence, the counter comprising:

a first circuit for advancing the external address to produce a next address of the predetermined sequence;

a second circuit for determining a second-to-last address of the sequence;

a third circuit for determining if the next address equals the second-to-last address and for asserting a burst-done signal in response thereto.

7. The synchronous memory device of claim 6 wherein the first circuit of the counter is an incrementor circuit.

8. The synchronous memory device of claim 6 wherein the second circuit of the counter is a minus-two subtractor circuit.

9. The synchronous memory device of claim 6 wherein the third circuit of the counter is a comparator.

10. The synchronous memory device of claim 6 wherein the first circuit of the counter comprises a burst sequencer so that the sequence of burst addresses is programmable.

11. A method for providing a sequence of burst addresses based upon an external address, the method comprising the steps of:

(a) receiving the external address into a register to become an intermediate address;

(b) supplying the intermediate address in the register to a sequencing circuit;

(c) sequencing the intermediate address that was supplied to the sequencing circuit to produce a next address of the sequence;

(d) receiving the next address into the register to become the intermediate address;

(e) comparing the intermediate address in the register with a reference address for determining when the sequence is complete.

12. The method of claim 11 further comprising the steps of:

if the sequence is not complete, repeating the steps of (b), (c), (d), and (e);

if the sequence is complete, asserting a burst-done signal.

13. The method of claim 11 further comprising the step of:

(f) driving the intermediate address to a memory circuit.

14. The method of claim 11 wherein the reference address is determined from the external address.

15. The method of claim 11 wherein the reference address is determined by subtracting two from the external address.

16. The method of claim 11 wherein the reference address is determined by inverting part of the external address.

17. The method of claim 11 wherein the sequencing is done by an incrementor.

18. The method of claim 11 wherein the sequencing is programmable to different burst sequences.

19. A semiconductor memory comprising:

a memory array including a plurality of bit line pairs, a plurality of word lines crossing the bit line pairs, a plurality of memory cells, and a plurality of sense amplifier circuits connected to the bit line pairs;

a common data line pair for the plurality of the bit line pairs;

a switch circuit selectively connecting a predetermined bit line pair of the plurality of the bit line pairs to the common data line pair;

an adder circuit which outputs a sequence of addresses;

an address holding circuit which holds an output address from the adder circuit as an input address of the adder circuit;

a subtractor circuit which forms an output address before a last address of the sequence of addresses on the basis of a first address of the sequence of addresses;

a comparator circuit which receives the input address of the adder circuit and the output address of the subtractor circuit; and a control circuit which controls the switch circuit based on the sequence of addresses;

wherein the operation of the adder circuit is stopped by an agreement detection signal from the comparator circuit.

20. A semiconductor memory according to claim 19, wherein the subtractor circuit is a circuit that subtracts two from the first address.

21. A semiconductor memory according to claim 20, wherein the first address is an external address and the initial value of the address holding circuit is the first address.

22. A semiconductor memory according to claim 21, further comprising:

an internal clock generation circuit which generates an internal clock signal based on an external clock signal;

wherein the adder circuit operates in synchronism with the internal clock signal.

(e) comparing the address that was received into the register with a reference address for determining when the sequence is complete.

* * * * *